(12) United States Patent
Higuchi

(10) Patent No.: US 12,538,633 B2
(45) Date of Patent: Jan. 27, 2026

(54) PHOTOELECTRIC CONVERSION MODULE

(71) Applicant: Panasonic Holdings Corporation, Osaka (JP)

(72) Inventor: Hiroshi Higuchi, Kyoto (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 18/763,587

(22) Filed: Jul. 3, 2024

(65) Prior Publication Data
US 2024/0365571 A1    Oct. 31, 2024

Related U.S. Application Data

(63) Continuation of application No. PCT/JP2022/042635, filed on Nov. 16, 2022.

(30) Foreign Application Priority Data

Jan. 7, 2022  (JP) ................. 2022-001951

(51) Int. Cl.
*H10K 30/88*  (2023.01)
*C09J 123/08*  (2006.01)
(Continued)

(52) U.S. Cl.
CPC ............ *H10K 30/88* (2023.02); *C09J 123/08* (2013.01); *C09J 129/04* (2013.01); *H10K 39/10* (2023.02); *H10K 85/50* (2023.02)

(58) Field of Classification Search
CPC ........ H10K 30/40; H10K 30/88; H10K 39/10; H10K 39/12; H10K 50/8426; H10K 59/8722; H10K 85/50

See application file for complete search history.

(56) References Cited

U.S. PATENT DOCUMENTS 5,507,880 A    4/1996 Ishikawa et al.
11,355,660 B2  6/2022 Li et al.
(Continued)

FOREIGN PATENT DOCUMENTS

CN    104039544 A  *  9/2014  ............... B32B 7/02
CN    113097387       7/2021
(Continued)

OTHER PUBLICATIONS

CN 104039544 A Translation provided by FIT database, translated on May 27, 2025.*
(Continued)

*Primary Examiner* — Golam Mowla
(74) *Attorney, Agent, or Firm* — Greenblum & Bernstein, P.L.C.

(57) ABSTRACT

A photoelectric conversion module according to the present disclosure includes: a substrate; a photoelectric conversion element; and a first sealing member, wherein the photoelectric conversion element is sealed by the substrate and the first sealing member, the first sealing member includes a first sealing portion formed of a first sealing material, and the first sealing material includes at least one selected from the group consisting of polyvinyl alcohol, an ethylene-vinyl alcohol copolymer, and a butylenediol-vinyl alcohol copolymer. The photoelectric conversion element may include, for example, a first electrode, a photoelectric conversion layer, and a second electrode in this order.

9 Claims, 4 Drawing Sheets

(51) Int. Cl.
*C09J 129/04* (2006.01)
*H10K 39/10* (2023.01)
*H10K 85/50* (2023.01)

(56) References Cited

U.S. PATENT DOCUMENTS

| | | |
|---|---|---|
| 2012/0125431 A1 | 5/2012 | Oizumi et al. |
| 2018/0330892 A1 | 11/2018 | Nishino et al. |
| 2019/0019628 A1 | 1/2019 | Higuchi |

FOREIGN PATENT DOCUMENTS

| | | |
|---|---|---|
| EP | 0 577 985 | 1/1994 |
| JP | 01-205473 | 8/1989 |
| JP | 02-009178 | 1/1990 |
| JP | 02-021670 | 1/1990 |
| JP | 02-170475 | 7/1990 |
| JP | 06-061518 | 3/1994 |
| JP | 2005-190934 | 7/2005 |
| JP | 2006-100069 | 4/2006 |
| JP | 2013-206926 | 10/2013 |
| JP | 2015-191965 | 11/2015 |
| JP | 2019-21913 | 2/2019 |
| JP | 2019-169615 | 10/2019 |
| JP | 6924887 | 8/2021 |
| WO | 2018/012392 | 1/2018 |

OTHER PUBLICATIONS

Extended European Search Report Issued in Corresponding EP Patent Application No. 22918725.7, dated Apr. 3, 2025.
Granstrom et al., "Multilayer barrier films comprising nitrogen spacers between free-standing barrier layers," Applied Physics Letters, vol. 95 (2009) pp. 093306-01-093306-03.
Granstrom et al., "High performance encapsulation structures utilizing Russian Doll architectures," Thin Solid Films, vol. 518 (2010) pp. 5282-5287.
Sun et al., "Role of Microstructure in Oxygen Induced Photodegradation of Methylammonium Lead Triiodide Perovskite Films", Advanced Energy Materials, vol. 7, 2017, pp. 1700977.
International Search Report issued in International Pat. Appl. No. PCT/JP2022/042635, dated Jan. 31, 2023, along with an English translation thereof.

* cited by examiner

PHOTOELECTRIC CONVERSION MODULE

This application is a continuation of PCT/JP2022/042635 filed on Nov. 16, 2022, which claims foreign priority of Japanese Patent Application No. 2022-001951 filed on Jan. 7, 2022, the entire contents of both of which are incorporated herein by reference.

BACKGROUND OF THE INVENTION

1. Field of the Invention

The present invention relates to a photoelectric conversion module.

2. Description of Related Art

Main functions of photoelectric conversion elements include a function of converting light into electricity and a function of converting electricity into light. Examples of photoelectric conversion elements with an optimized function of converting light into electricity include a photo-detecting element, a photo-receiving element, and a solar cell element. Examples of photoelectric conversion elements with an optimized function of converting electricity into light include an LED element (light-emitting diode element) and an EL element (electroluminescent element).

A photoelectric conversion element is formed of members such as a semiconductor layer for performing photoelectric conversion, an electrode layer for extracting current from the semiconductor layer, and a collection electrode layer for lowering resistance. These components undergo chemical changes due to external influences, resulting in degradation in performance of the photoelectric conversion element. One of the main external influences is water.

It is reported in Q. Sun and eight others, *Advanced Energy Materials*, July 2017, Volume 7, p. 1700977, that atmospheric water vapor reacts with perovskite compounds. The reaction results in formation of substances such as lead iodide, methylammonium iodide, or hydrated compounds on the surface and grain boundaries of the perovskite compound, where the substances do not contribute to power generation.

As a countermeasure, a sealing layer is provided between the above-mentioned members and the outside world to isolate the photoelectric conversion element from the influence of the outside world, that is, to create a photoelectric conversion module. However, the performance degradation of photoelectric conversion elements is not only caused by water, but oxygen may also affect considerably the performance. It is reported in Q. Sun and eight others, *Advanced Energy Materials*, July 2017, Volume 7, p. 1700977 that, under light irradiation, cations in the perovskite compound react with oxygen, so that a metal oxide or hydroxide is formed on the surface and grain boundaries of the perovskite compound.

SUMMARY OF THE INVENTION

As mentioned above, oxygen is a major cause of performance degradation of the photoelectric conversion element. However, the conventional configuration cannot block oxygen sufficiently, and there has been a demand for improving durability of the photoelectric conversion module.

The present disclosure aims to provide a photoelectric conversion module with improved durability.

A photoelectric conversion module of the present disclosure includes:
a substrate;
a photoelectric conversion element; and
a first sealing member,
wherein the photoelectric conversion element is sealed by the substrate and the first sealing member,
the first sealing member includes a first sealing portion formed of a first sealing material, and
the first sealing material includes at least one selected from the group consisting of polyvinyl alcohol, an ethylene-vinyl alcohol copolymer, and a butylenediol-vinyl alcohol copolymer.

The present disclosure provides a photoelectric conversion module with improved durability.

DETAILED DESCRIPTION

Embodiments of the present disclosure will be described below with reference to the attached drawings.

First Embodiment

The photoelectric conversion module according to the first embodiment includes a substrate, a photoelectric conversion element, and a first sealing member. The photoelectric conversion element is sealed by the substrate and the first sealing member. The first sealing member includes a first sealing portion formed of a first sealing material. The first sealing material includes at least one selected from the group consisting of polyvinyl alcohol, an ethylene-vinyl alcohol copolymer, and a butylenediol-vinyl alcohol copolymer.

The polyvinyl alcohol, the ethylene-vinyl alcohol copolymer, and the butylenediol-vinyl alcohol copolymer have extremely low oxygen permeability coefficients, namely, excellent oxygen barrier properties. Therefore, the first sealing member, which includes the first sealing portion formed of the first sealing material, has a function of reducing oxygen entering inside the photoelectric conversion module from outside of the module. As a result, in the photoelectric conversion module according to the first embodiment, degradation in the performance of the photoelectric conversion element can be prevented, where the degradation is caused by chemical changes under the influence of oxygen. In this manner, durability of the photoelectric conversion module can be improved.

The oxygen permeability coefficient can be measured using the method described in Japanese Industrial Standards (JIS K-7126).

The first sealing member may further include a second sealing portion. In this case, the second sealing portion may be a plate-shaped body disposed facing the substrate, and the first sealing portion may be a sealing layer for sealing an area provided between the substrate and the plate-shaped body that is the second sealing portion.

Figure 1:
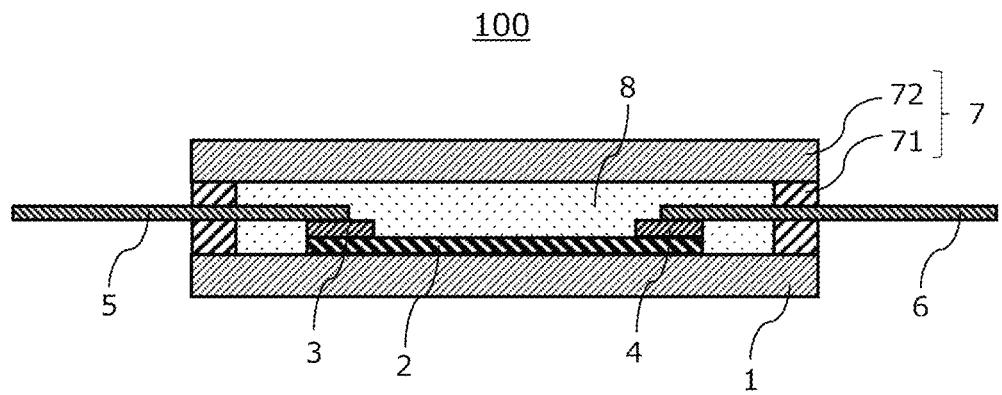
FIG. 1 is a cross-sectional view schematically showing a photoelectric conversion module 100 according to a first embodiment.

FIG. 1 is a cross-sectional view schematically showing the photoelectric conversion module 100 according to the first embodiment.

The photoelectric conversion module 100 includes a substrate 1, a photoelectric conversion element 2, and a first sealing member 7. The photoelectric conversion element 2 is sealed by the substrate 1 and the first sealing member 7. The photoelectric conversion module 100 may further include a terminal 3, a terminal 4, a conductive wire 5, and a conductive wire 6. The first sealing member 7 includes a first sealing portion 71 formed of a first sealing material. As mentioned above, the first sealing material includes at least one selected from the group consisting of polyvinyl alcohol, an ethylene-vinyl alcohol copolymer, and a butylenediol-vinyl alcohol copolymer.

The first sealing member 7 may further include a second sealing portion 72. As shown in FIG. 1, the second sealing portion 72 is a plate-shaped body disposed facing the substrate 1, for example. In this case, the first sealing portion 71 may be a sealing layer for sealing an area provided between the substrate 1 and the second sealing portion 72.

The first sealing portion 71 may be provided like a frame between the substrate 1 and the second sealing portion 72 so as to surround the photoelectric conversion element 2. Alternatively, the first sealing portion 71 may be provided like a frame so as to surround the periphery of the substrate 1 and the second sealing portion 72.

The conductive wires 5 and 6 are connected to photoelectric conversion element 2 via the terminals 3 and 4, respectively.

The conductive wires 5 and 6 may penetrate the first sealing member 7 to extend outward. In the photoelectric conversion module 100 shown in FIG. 1, the conductive wires 5 and 6 penetrate the first sealing portion 71. In this case, it is required that the sealing of a space sealed by the substrate 1 and the first sealing member 7 be maintained.

Hereinafter, the terminals 3 and 4 may be collectively referred to simply as terminal. The conductive wires 5 and 6 may be collectively referred to simply as conductive wire.

The first sealing member 7 has a function of preventing oxygen present outside the photoelectric conversion module 100 from entering the inside of the module. This serves to prevent degradation in the performance of the photoelectric conversion element 2 in the first embodiment. The deterioration in performance is caused by chemical changes under the influence of oxygen in the photoelectric conversion module 100. Therefore, durability of the photoelectric conversion module 100 can be improved.

The photoelectric conversion module in the first embodiment may further include a filling material disposed in an area to be sealed by the substrate and the first sealing material. The photoelectric conversion module 100 shown in FIG. 1 is provided with a first filling material 8 in an area to be sealed by the substrate 1 and the first sealing member 7. As shown in FIG. 1, the area sealed by the substrate 1 and the first sealing member 7 may be filled with the first filling material 8.

Hereinafter, the respective components of the photoelectric conversion module will be explained in detail below.

(Substrate 1)

The substrate 1 is, for example, formed of an oxygen-impermeable material. A part of the substrate 1, which is to be in contact with the photoelectric conversion element 2, is formed of a non-conductive material.

Examples of materials for the substrate 1 include glass, ceramics, metals, polyvinyl alcohol, an ethylene-vinyl alcohol copolymer and a butylenediol-vinyl alcohol copolymer.

The substrate 1 may be prepared by coating a resin sheet (resin film) with glass, ceramics, polyvinyl alcohol, an ethylene-vinyl alcohol copolymer, or a butylenediol-vinyl alcohol copolymer. In this case, the coated surface faces the photoelectric conversion element 2.

The substrate 1 may be a metal-based sheet having a surface coated with glass, ceramics, an insulating resin or the like.

The substrate 1 may be formed of a material impermeable to oxygen and water. Examples of the materials include glass and ceramics. The substrate 1 may be formed of glass.

(First Sealing Member 7)

The first sealing member 7 includes a first sealing portion 71 formed of a first sealing material. The first sealing material includes at least one selected from the group consisting of polyvinyl alcohol, an ethylene-vinyl alcohol copolymer, and a butylenediol-vinyl alcohol copolymer. Usually, the first sealing material may include an ethylene-vinyl alcohol copolymer.

The first sealing portion 71 is formed of, for example, an oxygen-impermeable material. Here, an oxygen-impermeable material means a material having an oxygen permeability coefficient of 0.1 $cm^3 \cdot mm/m^2 \cdot day \cdot atm$ or less. The first sealing portion 71 may include the first sealing material as a main component. That is, the first sealing portion 71 may include the first sealing material in a mass proportion of 50% or more (50% by mass or more) with respect to the entire first sealing portion 71. The first sealing portion 71 may include the first sealing material in a mass proportion of 70% or more (70% by mass or more) with respect to the entire first sealing portion 71. The first sealing portion 71 may include the first sealing material in a mass proportion of 90% or more (90% by mass or more) with respect to the entire first sealing portion 71. The first sealing portion 71 may consist of the first sealing material.

The polyvinyl alcohol may have a degree of saponification of 80 mol % or more, 85 mol % or more, 90 mol % or more, 95 mol % or more, 97 mol % or more, or 98 mol % or more. The degree of saponification of the polyvinyl alcohol may be 99.5 mol %. The ethylene-vinyl alcohol copolymer may have a degree of saponification of 90 mol % or more, 95 mol % or more, 97 mol % or more, or 100 mol %. The ethylene-vinyl alcohol copolymer may have an ethylene content of 20 mol % or more, 27 mol % or more, 35 mol % or more, or 44 mol % or more. The butylenediol-vinyl alcohol copolymer may have a degree of saponification of 90 mol % or more, 95 mol % or more, 97 mol % or more, or 99 mol % or more. The butylenediol-vinyl alcohol copolymer may have a butylenediol content of 20 mol % or more, 27 mol % or more, 35 mol % or more, or 44 mol %.

The first sealing material may consist of at least one selected from the group consisting of polyvinyl alcohol, an ethylene-vinyl alcohol copolymer, and a butylenediol-vinyl alcohol copolymer.

The first sealing portion 71 may be formed by melt-coating polyvinyl alcohol, an ethylene-vinyl alcohol copolymer, or a butylenediol-vinyl alcohol copolymer. Alternatively, the first sealing portion 71 may be formed by coating a solution of polyvinyl alcohol, an ethylene-vinyl alcohol copolymer, or a butylenediol-vinyl alcohol copolymer, and drying.

The first sealing member 7 may further include a second sealing portion. The second sealing portion includes a plate-shaped body disposed facing the substrate 1, and the first sealing portion 71 may seal an area provided between the substrate 1 and the second sealing portion. For example, in the photoelectric conversion module 100 shown in FIG. 1, the first sealing member 7 includes a second sealing portion 72 in addition to the first sealing portion 71. The second sealing portion 72 is a plate-shaped body disposed facing the substrate 1, and the first sealing portion 71 is a sealing layer for sealing an area provided between the substrate 1 and the second sealing portion 72.

The first sealing portion 71 may have a function of an adhesive agent or the like to bond the substrate 1 and the second sealing portion 72.

The second sealing portion 72 is formed of an oxygen-impermeable material.

Examples of materials for the second sealing portion 72 includes glass, ceramics, metals, polyvinyl alcohol, an ethylene-vinyl alcohol copolymer, and a butylenediol-vinyl alcohol copolymer.

The second sealing portion 72 may be formed by coating a resin sheet (resin film) with glass, ceramics, a metal, polyvinyl alcohol, an ethylene-vinyl alcohol copolymer, or a butylenediol-vinyl alcohol copolymer. In this case, the coated surface faces the photoelectric conversion element 2.

The second sealing portion 72 may be formed of a material impermeable to oxygen and water. Examples of the materials include glass and ceramics. The second sealing portion 72 may be formed of glass.

In a case where the photoelectric conversion element 2 generates electricity with incident light from either or both of the substrate 1 and the second sealing portion 72, either or both of the substrate 1 and the second sealing portion 72, both of which are in the light incident path, are made of a light-transmitting material. Examples of the materials include: glass; translucent ceramics; and a translucent resin coated with glass, translucent ceramics, polyvinyl alcohol, an ethylene-vinyl alcohol copolymer, or a butylenediol-vinyl alcohol copolymer.

In FIG. 1, the first sealing member 7 in the photoelectric conversion module 100 includes the second sealing portion 72. In the first embodiment, the second sealing portion 72 of the photoelectric conversion module 100 shown in FIG. 1 may be replaced by the first sealing portion 71. That is, the first sealing member 7 may not include the second sealing portion 72. The first sealing member 7 may consist of the first sealing portion 71. That is, the photoelectric conversion element 2 may be sealed by the substrate 1 and the first sealing portion 71. The first sealing portion 71 may cover a surface of the photoelectric conversion element 2 supported by the substrate 1.

(Conductive Wire)

A conductive wire is electrically connected to the photoelectric conversion element 2 via a terminal. In other words, the conductive wire is connected, as a mounting terminal, to an external circuit.

The conductive wire is formed of a material that is impermeable to oxygen and water while it is electrically conductive. Examples of the materials include metals and conductive compounds. Examples of metals include copper, aluminum, nickel, iron, chromium, and titanium. Examples of conductive compounds include indium tin oxide, and fluorine doped tin oxide.

(Terminal)

A terminal is formed of an electrically conductive material. Examples of the materials include metals and conductive compounds. The terminal may be a solder.

Solder with a melting temperature of 150° C. or higher and 300° C. or lower can be used.

The terminal can be formed by an ultrasonic soldering method.

(First Filling Material 8)

The first filling material 8 disperses energy of impact applied from outside the photoelectric conversion module, and prevents the substrate 1 and the first sealing member 7 from being destroyed.

Examples of the materials for the first filling material 8 include an EVA-based resin (namely, ethylene-vinyl acetate copolymer), and a PO-based resin (namely, polyolefin).

The first filling material 8 may include at least one selected from the group consisting of an oxygen absorbent material and a moisture absorbent material. Examples of oxygen absorbent materials include metals, metalloids such as Si or C, not-completely oxidized oxides of metals or metalloids, titanium oxide ($TiO_2$), cerium oxide ($CeO_2$), and iron hydroxide ($Fe(OH)_2$). The oxygen absorbent material may be an iron powder. Examples of the moisture absorbent materials include metals, metalloids such as Si or C, not-completely oxidized oxides of metals or metalloids, silicon oxide ($SiO_2$) (e.g. silica gel), calcium oxide (CaO) (e.g. quicklime), calcium chloride ($CaCl_2$)), and activated alumina ($Al_2O_3$). The moisture absorbent material may be at least one selected from an iron powder and calcium oxide. The moisture absorbent material may be calcium oxide.

The first filling material 8 may include an oxygen absorbent material.

(Photoelectric Conversion Element 2)

Hereinafter, each component of a photoelectric conversion element 2 will be explained in detail.

The photoelectric conversion element 2 includes a first electrode, a photoelectric conversion layer, and a second electrode in this order. The photoelectric conversion element 2 may further include an electron transport layer between the first electrode and the photoelectric conversion layer, or the photoelectric conversion element 2 may further include a hole transport layer between the photoelectric conversion layer and the second electrode. The photoelectric conversion element 2 may include a first electrode, an electron transport layer, a photoelectric conversion layer, a hole transport layer, and a second electrode in this order.

Figure 2:
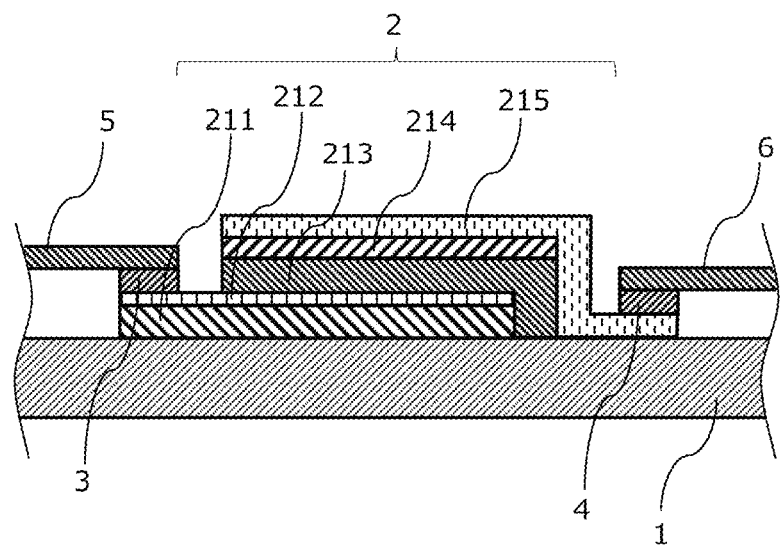
FIG. 2 is a partial enlarged cross-sectional view of a photoelectric conversion module of the present disclosure, schematically showing a first configuration example of a photoelectric conversion element 2 of the present disclosure.

FIG. 2 is a partial enlarged cross-sectional view of the photoelectric conversion module of the present disclosure, schematically showing a first configuration example of the photoelectric conversion element 2 of the present disclosure. FIG. 2 shows a photoelectric conversion element 2 with a single-cell structure.

Each element for forming the photoelectric conversion element 2 will be explained with reference to FIG. 2.

FIG. 2 shows the photoelectric conversion element 2 disposed on the substrate 1. The photoelectric conversion element 2 includes a first electrode 211, an electron transport layer 212, a photoelectric conversion layer 213, a hole transport layer 214, and a second electrode 215 in this order.

Alternatively, the photoelectric conversion element 2 may include a second electrode 215, a hole transport layer 214, a photoelectric conversion layer 213, an electron transport layer 212, and a first electrode 211 in this order. That is, the second electrode 215 may face the substrate 1.

The photoelectric conversion element 2 may include a perovskite compound.

The perovskite compound may include Pb.

The perovskite compound is represented by a chemical formula $APbX_3$ where A may be at least one selected from the group consisting of $CH_3NH_3$, $NH_2CH_2NH_2$, K, Cs, and Rb. And X may be at least one selected from the group consisting of Cl, Br, and I.

(First Electrode 211)

The first electrode 211 is electrically conductive. The first electrode 211 has a function of accepting electrons generated in the photoelectric conversion layer 213 and extracting the electrons to the outside.

Desirably, the first electrode 211 has low electrical resistance.

Examples of materials configuring the first electrode 211 include metals, conductive compounds exhibiting electronic conductivity, and conductive carbon exhibiting electronic conductivity.

Almost any metals are applicable without any particular limitations.

In a case where the first electrode 211 is required to have light transmittance, a conductive compound having light transmittance is desired. Examples of the conductive compounds include: oxide of indium, zinc, or tin; oxide and nitride of titanium; and organic conductors. Fluorine-doped tin oxide ($SnO_2$:F), indium tin oxide (ITO), Al-doped zinc oxide (ZnO:Al), Ga-doped zinc oxide (ZnO:Ga), Nb-doped titanium oxide ($TiO_2$:Nb), and barium tin oxide (BTO) have a low volume resistivity, therefore these oxides can be used in outdoor solar cells that carry large currents. $SnO_2$:F, ITO, ZnO:Al, ZnO:Ga, $TiO_2$:Nb, and BTO also have light transmittance, and thus, these substances are particularly useful for photoelectric conversion elements.

Examples of the conductive carbons include carbon black, carbon nanotube (CNT), graphene, and graphite. The ketjen black and the acetylene black are materials classified in the carbon black.

Examples of methods for manufacturing the first electrode 211 include: vacuum film-forming methods such as sputtering, vapor deposition, and ion plating; screen printing; spraying; and CVD (Chemical Vapor Deposition). CVD is a method of forming a film on a heated substrate surface by spraying fine droplets or a gas of a special material liquid onto the substrate. For example, the first electrode 211 may be produced by sputtering so that the sheet resistance value of ITO on the substrate 1 will be approximately $10\Omega/\square$ or more and $40\Omega/\square$ or less.

(Electron Transport Layer 212)

The electron transport layer 212 has a function of accepting electrons in a conduction band of the photoelectric conversion layer 213 and conducting the electrons to the first electrode 211, while insulating holes in a valence band of the photoelectric conversion layer 213.

The electron transport layer 212 includes an electron transport material. The electron transport material is a material capable of transporting electrons. The electron transport material can be a semiconductor.

Examples of electron transport materials include titanium oxide or tin oxide.

In an example of methods for manufacturing the electron transport layer 212, an alcohol dispersion (for example, concentration: 1 mass %) including $TiO_2$ nanoparticles is applied with a spinner or spray, and the alcohol is removed by heating to or above 100° C. For example, an electron transport layer 212 may be formed on the first electrode 211 by sputtering $TiO_2$ so that the film thickness of the $TiO_2$ will be 10 nm or more and 100 nm or less. Furthermore, an electron transport layer 212 may be formed by forming an aggregate of $TiO_2$ nanoparticles with a thickness of approximately 100 nm or more and approximately 500 nm or less.

(Photoelectric Conversion Layer 213)

The photoelectric conversion layer 213 has a function of accepting incident light, generating electrons and holes, and diffusing the electrons and the holes without recombining the electrons and the holes.

The photoelectric conversion layer 213 may include a perovskite compound.

The perovskite compound indicates a compound having a perovskite type crystal structure represented by a composition formula $ABX_3$ and a compound having a structure similar to the perovskite type crystal structure. Here, A is a monovalent cation, B is a divalent cation, and X is a monovalent anion.

Examples of the monovalent A include an alkali metal cation and an organic cation. Examples of alkali metal cations include sodium cation ($Na^+$), potassium cation ($K^+$), cesium cation ($Cs^+$), and rubidium cation ($Rb^+$). Examples of organic cations include methylammonium cation ($CH_3NH_3^+$) and formamidinium cation ($NH_2CHNH_2^+$).

Examples of divalent cations B include Pb cation, Sn cation, and Ge cation. The cation B may include Pb cation.

An example of monovalent anion X is halogen anion. Examples of halogen anions include chlorine anion, iodine anion and bromine anion.

Each site of the cation A, the cation B, and the anion X may be occupied by a plurality of types of ions.

The photoelectric conversion layer 213 may have a thickness of 50 nm or more and 10 µm or less.

In an example of method of manufacturing the photoelectric conversion layer 213, a solution prepared by dissolving a specified material in an organic solvent is applied, the organic solvent is removed from the coating film, and the coating is further heat-treated. As to removal of the organic solvent from the coating film, for example, the pressure can be reduced to evaporate and remove the organic solvent. Alternatively, by adding a solvent that is a poor solvent for the predetermined material dissolved in the organic solvent while is compatible with the organic solvent, only the organic solvent can be removed from the coating film. These methods may be commonly used. According to these methods, a photoelectric conversion layer 213 with high performance can be easily manufactured. An alternative method of manufacturing the photoelectric conversion layer 213 may be vacuum deposition.

(Hole Transport Layer 214)

A hole transport layer 214 has a function of accepting only the holes from the photoelectric conversion layer 213 and blocking electrons.

The hole transport layer 214 includes a hole transport material. The hole transport material is a material capable of transporting holes. The hole transport material desirably has a HOMO (Highest Occupied Molecular Orbital) level close to the HOMO level of photoelectric conversion layer 213 and a LUMO level (Lowest Unoccupied Molecular Orbital) higher than the LUMO level of the photoelectric conversion layer 213.

For example, in a case of a photoelectric conversion element that includes a perovskite compound, the LUMO level of the photoelectric conversion layer 213 is around −4 eV, and the HOMO level is around −5 eV. Therefore, examples of the hole transport materials include: poly(bis (4-phenyl)(2,4,6-trimethylphenyl))amine (PTAA), $N^2,N^2, N^{2'},N^{2'},N^7,N^7,N^{7'},N^{7'}$-octakis(4-methoxyphenyl)-9,9'-spirobi[9H-fluorene]-2,2',7,7'-tetramine (Spiro-OMeTAD), a dithiophenebenzene copolymer (DTB), poly3 hexylthiophene (P3HT), and a poly3 hexylthiophene-polystyrene block polymer (P3HT-b-PSt).

The hole transport layer 214 may include at least one selected from the group consisting of PTAA, Spiro-OMeTAD, DTB, P3HT, and P3HT-b-PSt. Note that when any of these materials is used alone, sufficient hole density in the hole transport layer 214 may not be obtained. For this reason, the hole transport layer 214 may include not only the hole transport material but also an additive. The additive has a function of depriving the hole transport material of electrons in the valence band. In other words, the hole transport layer 214 may include a p-type dopant.

(Second Electrode 215)

A second electrode 215 is electrically conductive. The second electrode 215 has a function of accepting holes generated in the photoelectric conversion layer 213 and extracting the holes to the outside.

As the materials for forming the second electrode 215, any of the materials exemplified as the materials for forming the first electrode 211 may be used.

Figure 3:
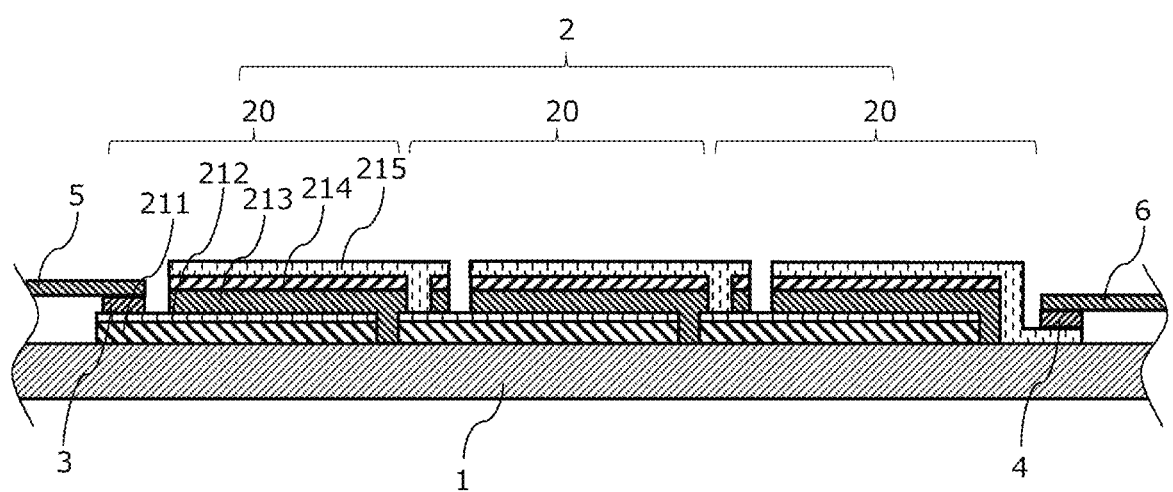
FIG. 3 is a partial enlarged cross-sectional view of a photoelectric conversion module of the present disclosure, schematically showing a second configuration example of the photoelectric conversion element 2 of the present disclosure.

The photoelectric conversion element 2 may have a structure in which a plurality of cells are connected to each other. FIG. 3 is a partial enlarged cross-sectional view of the photoelectric conversion module of the present disclosure, schematically showing a second configuration example of the photoelectric conversion element 2 of the present disclosure. FIG. 3 shows the photoelectric conversion element 2, which has a 3-series cell structure, as an example of a structure in which a plurality of cells are connected in series.

In the photoelectric conversion element 2 shown in FIG. 3, three cells 20 are connected in series. The first electrode 211 is electrically connected to the second electrode 215 of an adjacent cell 20 via the electron transport layer 212. The photoelectric conversion element 2 is connected to the conductive wires 5 and 6 via the terminals 3 and 4, respectively. The terminal 3 and the conductive wire 5 are electrically connected to the first electrode 211 of the cell 20 located at one end of the 3-series cell structure via the electron transport layer 212. The terminal 4 and the conductive wire 6 are electrically connected to the second electrode 215 of the cell 20 located at the other end.

Second Embodiment

The photoelectric conversion module in the second embodiment will be explained below. Items explained in the first embodiment may be omitted as appropriate.

The photoelectric conversion module according to the second embodiment further includes a second sealing member in addition to the components forming the photoelectric conversion module according to the first embodiment. The second sealing member is provided so that the first sealing portion of the first sealing member will not be exposed to the surface of the photoelectric conversion module. The second sealing member includes a second sealing material that is a material different from the first sealing material. According to this configuration, the sealing effect can be improved by reducing the influence of outside air on the first sealing member 7 and improving the durability of the first sealing member 7. Therefore, the durability of the photoelectric conversion module can be further improved. For example, photoelectric conversion modules can be durable even when used outdoors.

Here, the configuration where the first sealing portion of the first sealing member is not exposed to the surface of the photoelectric conversion module indicates that the first sealing portion of the first sealing member is not in contact with the open air.

The second sealing member may include an area formed of the second sealing material. Hereinafter, the area formed of the second sealing material in the second sealing member will be referred to as a third sealing portion.

Figure 4:
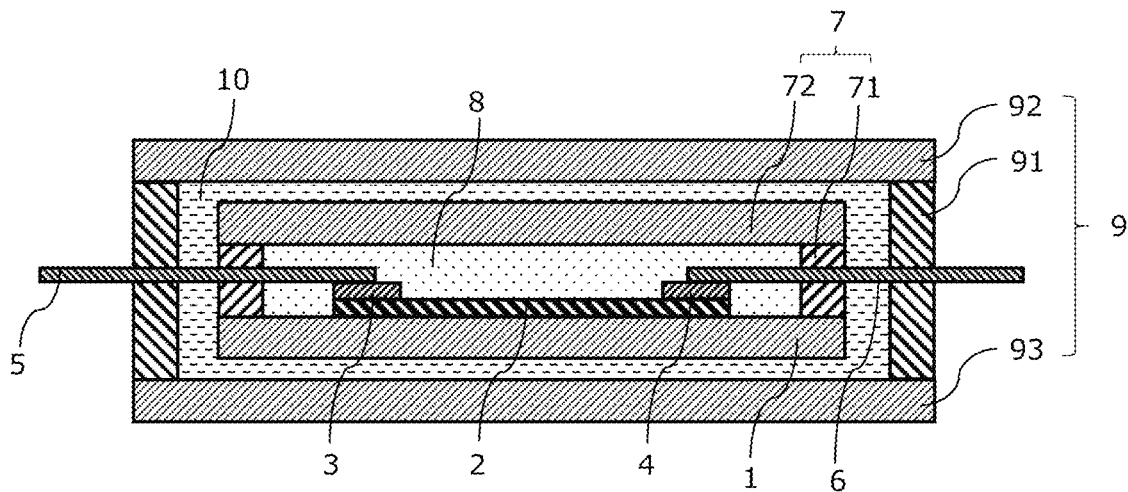
FIG. 4 is a cross-sectional view schematically showing a first configuration example of a photoelectric conversion module according to a second embodiment.

FIG. 4 is a cross-sectional view schematically showing a first configuration example of the photoelectric conversion module according to the second embodiment.

A photoelectric conversion module 210 shown in FIG. 4 includes a second sealing member 9. The area to be sealed by second sealing member 9 encapsulates the photoelectric conversion element 2, the substrate 1, and the first sealing member 7. The second sealing member 9 includes a third sealing portion 91. The second sealing member 9 further includes a first plate-shaped body 92 and a second plate-shaped body 93 that are disposed to face each other with a spacing therebetween. The third sealing portion 91 is a sealing layer for sealing an area provided between the first plate-shaped body 92 and the second plate-shaped body 93. Between the first plate-shaped body 92 and the second plate-shaped body 93, the photoelectric conversion module 100 according to the first embodiment is disposed. The conductive wires 5 and 6 penetrate the third sealing portion 91.

The third sealing portion 91 may be provided like a frame between the first plate-shaped body 92 and the second plate-shaped body 93 so as to surround the substrate 1 and the first sealing member 7.

As shown in FIG. 4, the second sealing member 9 may encapsulate the photoelectric conversion module 100 of the first embodiment. That is, the substrate 1 and the first sealing member 7 may be sealed by the second sealing member 9. The first sealing portion 71 of the first sealing member 7 may be sealed by the second sealing member 9.

The photoelectric conversion module in the second embodiment may further include a filling material provided between the first sealing member 7 and the second sealing member 9. In the photoelectric conversion module 210 shown in FIG. 4, a second filling material 10 is provided between the first sealing member 7 and the second sealing member 9. As shown in FIG. 4, a space between the first sealing member 7 and the second sealing member 9 may be filled with the second filling material 10.

Figure 5:
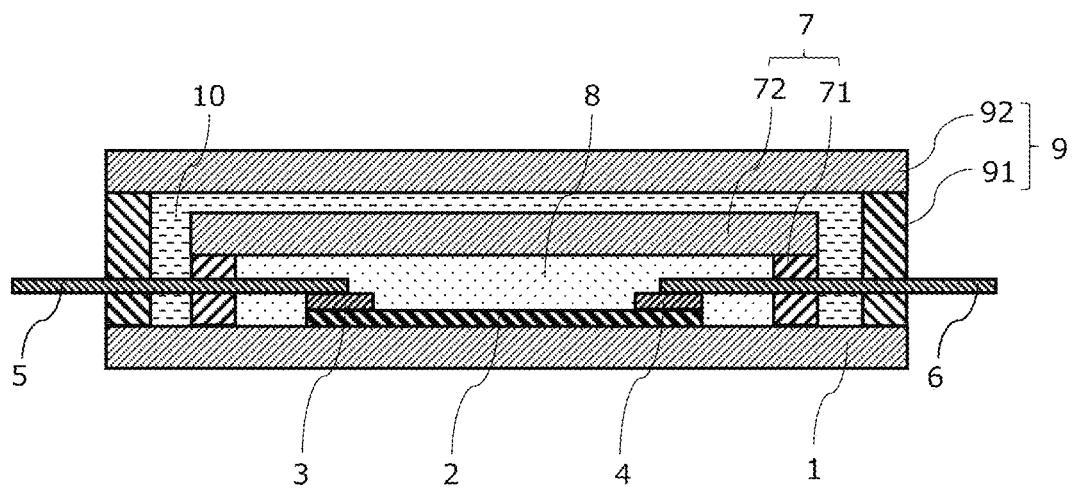
FIG. 5 is a cross-sectional view schematically showing a second configuration example of the photoelectric conversion module according to the second embodiment.

FIG. 5 is a cross-sectional view schematically showing a second configuration example of the photoelectric conversion module according to the second embodiment.

In the photoelectric conversion module 220 shown in FIG. 5, a second sealing member 9 includes a third sealing portion 91 and a first plate-shaped body 92 disposed facing the substrate 1 with a spacing therebetween. The third sealing portion 91 is a sealing layer for sealing an area provided between the substrate 1 and the first plate-shaped body 92.

As shown in FIG. 5, in the photoelectric conversion module according to the second embodiment, the area to be sealed by the substrate 1 and the second sealing member 9 may encapsulate the photoelectric conversion element 2 and the first sealing member 7. That is, the first sealing member 7 may be sealed by the substrate 1 and the second sealing member 9. The first sealing portion 71 of the first sealing member 7 may be sealed by the substrate 1 and the second sealing member 9.

Figure 6:
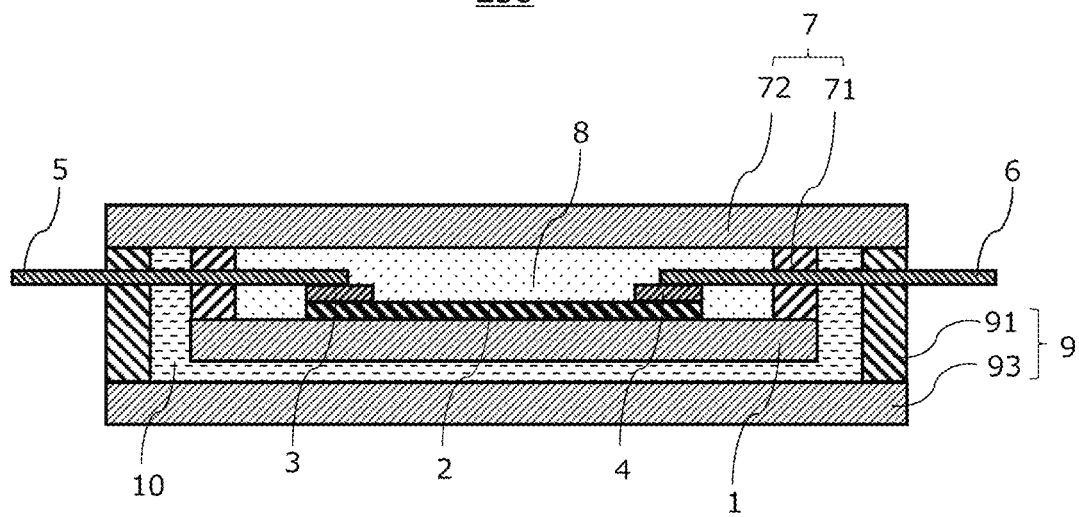
FIG. 6 is a cross-sectional view schematically showing a third configuration example of the photoelectric conversion module according to the second embodiment.

FIG. 6 is a cross-sectional view schematically showing a third configuration example of the photoelectric conversion module according to the second embodiment.

In a photoelectric conversion module 230 shown in FIG. 6, a second sealing member 9 includes a third sealing portion 91 and a second plate-shaped body 93 disposed facing a second sealing portion 72 of a first sealing member 7 with a spacing therebetween. The third sealing portion 91 is a sealing layer for sealing an area provided between the second sealing portion 72 and the second plate-shaped body 93.

As shown in FIG. 6, the area to be sealed by the second sealing portion 72 of the first sealing member 7 and the second sealing member 9 may encapsulate a photoelectric conversion element 2, a substrate 1 and a first sealing portion 71 of the first sealing member 7. That is, the substrate 1 and the first sealing portion 71 may be sealed by the second sealing portion 72 of the first sealing member 7 and the second sealing member 9.

Figure 7:
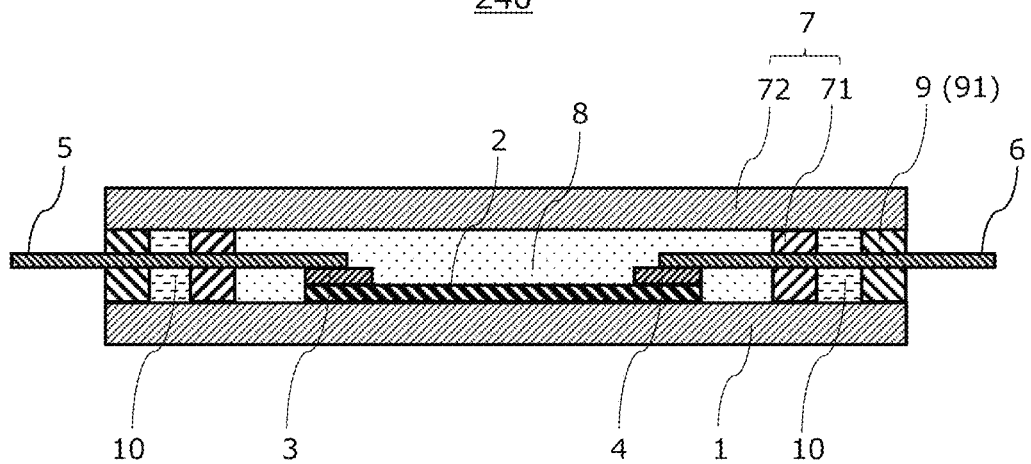
FIG. 7 is a cross-sectional view schematically showing a fourth configuration example of the photoelectric conversion module according to the second embodiment.

FIG. 7 is a cross-sectional view schematically showing a fourth configuration example of the photoelectric conversion module according to the second embodiment.

In the photoelectric conversion module 240 shown in FIG. 7, a second sealing member 9 is located between a substrate 1 and a second sealing portion 72 of a first sealing member 7, and outside of a first sealing portion 71. The second sealing member 9 is a sealing layer for sealing an area provided between the substrate 1 and the second sealing portion 72 of the first sealing member 7. The second sealing member 9 is composed of the third sealing portion 91.

As shown in FIG. 7, the second sealing member 9 may consist of the third sealing portion 91 formed of a second sealing material.

The first sealing portion 71 may be sealed by the substrate 1, the first sealing member 7, and the second sealing member 9. The first sealing portion 71 may be sealed by the substrate 1, the second sealing portion 72 of the first sealing member 7, and the second sealing member 9.

(Second Sealing Member 9)

The second sealing member 9 includes a second sealing material that is a material different from the first sealing material. A material that is different from the first sealing material is, for example, a material that has a water vapor barrier property superior to that of the first sealing material. The second sealing material may be a material with a water vapor permeability coefficient lower than that of the first sealing material. For example, the composition of the second sealing material is different from the composition of the first sealing material. With this configuration, influences of water vapor on the photoelectric conversion element 2 can be reduced. Furthermore, influences of water vapor on the first sealing member 7 can be reduced, and the durability of the first sealing member 7 can also be improved. Therefore, the durability of the photoelectric conversion module can be improved even when used outdoors.

The water vapor permeability coefficient can be measured using the method described in Japanese Industrial Standards (JIS K-7126).

The second sealing member 9 may include an area formed of the second sealing material, i.e., a third sealing portion 91.

The third sealing portion 91 is formed of a water-impermeable material, for example. The third sealing portion 91 may include the second sealing material as the main component. That is, the third sealing portion 91 may include the second sealing material in a mass proportion of 50% or more (50 mass % or more) to the entire third sealing portion 91. The third sealing portion 91 may include the second sealing material in a mass proportion of 70% or more (70 mass % or more) to the entire third sealing portion 91. The third sealing portion 91 may include the second sealing material in a mass proportion of 90% or more (90 mass % or more) to the entire third sealing portion 91. The third sealing portion 91 may consist of the second sealing material.

The second sealing material may include at least one selected from the group consisting of polyisobutylene and an isobutylene-isoprene copolymer.

An example of material for forming the third sealing portion 91 is butyl rubber (namely, a sulfur cross-linked rubber of an isobutylene-isoprene copolymer).

The third sealing portion 91 can be formed by melt coating of butyl rubber, or by applying butyl rubber sheets and treating with heat.

As in the first configuration example shown in FIG. 4, the second sealing member 9 may further include the first plate-shaped body 92 and the second plate-shaped body 93 in addition to the third sealing portion 91. The first plate-shaped body 92 and the second plate-shaped body 93 may be disposed to face each other. The third sealing portion 91 may be a sealing layer for sealing an area provided between the substrate 1 and the second sealing portion 72.

The third sealing portion 91 may have a function of an adhesive agent for bonding the first plate-shaped body 92 and the second plate-shaped body 93.

As in the second configuration example shown in FIG. 5, the second sealing member 9 may further include the first plate-shaped body 92 in addition to the third sealing portion 91. The first plate-shaped body 92 may be disposed facing the substrate 1. The third sealing portion 91 may be a sealing layer for sealing an area provided between the substrate 1 and the first plate-shaped body 92.

The third sealing portion 91 may have a function of an adhesive agent for bonding the substrate 1 and the first plate-shaped body 92.

In a third configuration example shown in FIG. 6, the second sealing member 9 may further include the second plate-shaped body 93 in addition to the third sealing portion 91. The second plate-shaped body 93 may be disposed facing the second sealing portion 72 of the first sealing member 7. The third sealing portion 91 may be a sealing layer for sealing an area provided between the second sealing portion 72 and the second plate-shaped body 93.

The third sealing portion 91 may have a function of an adhesive agent for bonding the second sealing portion 72 and the second plate-shaped body 93.

The first plate-shaped body 92 and the second plate-shaped body 93 are formed of a water-impermeable material, for example.

Examples of materials of the first plate-shaped body 92 and the second plate-shaped body 93 include glass, ceramics, and metals. The first plate-shaped body 92 and the second plate-shaped body 93 may be formed of glass.

The first plate-shaped body 92 and the second plate-shaped body 93 may be formed of a material that is impermeable to oxygen and water. Examples of the materials include glass and ceramics.

In a case where the photoelectric conversion element 2 generates incident light from either or both of the first plate-shaped body 92 and the second plate-shaped body 93, either or both of the plate-shaped bodies in the light incident path are required to have light transmittance. Examples of such materials include glass and translucent ceramics. Furthermore, glass or a resin coated with a thin film of translucent ceramics can also be used. In a case where translucency is not required, a metal can also be used for the first plate-shaped body 92 and second plate-shaped body 93.

In FIG. 4 to FIG. 6, the second sealing member 9 includes at least one selected from the group consisting of the first plate-shaped body 92 and the second plate-shaped body 93. As a variation of the configurations shown in FIG. 4 to FIG. 6, at least one selected from the group consisting of the first plate-shaped body 92 and the second plate-shaped body 93 in the photoelectric conversion modules shown in FIGS. 4 to 6 may be replaced by the third sealing portion 91 that is an area formed of the second sealing material. That is, the second sealing member 9 may not include the first plate-shaped body 92 and the second plate-shaped body 93. The second sealing member 9 may consist of the third sealing portion 91 that is an area formed of a second sealing material.

At least a part of the surface of the photoelectric conversion module according to the first embodiment may be covered with the third sealing portion 91. The first sealing member 7 may be covered with the third sealing portion 91. The first sealing portion 71 of the first sealing member 7 may be covered with the third sealing portion 91. The entire surface of the photoelectric conversion module according to the first embodiment may be covered with the third sealing portion 91.

(Second Filling Material 10)

The second filling material 10 disperses the energy of impact by transferring impact applied from outside the photoelectric conversion module, for example, to the substrate 1, the second sealing portion 72, and the first sealing member 7, thereby preventing the second sealing member 9 subjected to the impact from breaking.

Examples of materials for the second filling material 10 include an EVA-based resin (i.e., ethylene-vinyl acetate copolymer) and a PO-based resin (i.e., polyolefin).

The second filling material 10 may include at least one selected from the group consisting of an oxygen absorbent material and a moisture absorbent material. Examples of oxygen absorbent materials include metals, metalloids such as Si or C, not-completely oxidized oxides of metals or metalloids, titanium oxide ($TiO_2$), cerium oxide ($CeO_2$), and iron hydroxide ($Fe(OH)_2$). The oxygen absorbent material may be an iron powder. Examples of moisture absorbent materials are metals, metalloids such as Si or C, not-completely oxidized oxides of metals or metalloids, silicon oxide ($SiO_2$) (for example, silica gel), calcium oxide (CaO) (for example, quicklime), chloride calcium ($CaCl_2$), and activated alumina ($Al_2O_3$). The moisture absorbent material may be at least one selected from an iron powder and calcium oxide. The moisture absorbent material may be calcium oxide.

The second filling material 10 may include a moisture absorbent material.

Other Embodiments (Additional Statement)

Based on the above description of embodiments, the following techniques will be disclosed.

(Technique 1)

A photoelectric conversion module including:
a substrate;
a photoelectric conversion element; and
a first sealing member,
wherein the photoelectric conversion element is sealed by the substrate and the first sealing member,
the first sealing member includes a first sealing portion formed of a first sealing material, and
the first sealing material includes at least one selected from the group consisting of polyvinyl alcohol, an ethylene-vinyl alcohol copolymer, and a butylenediol-vinyl alcohol copolymer.

This configuration can improve the durability of the photoelectric conversion module.

(Technique 2)

The photoelectric conversion module according to Technique 1, wherein
the first sealing member further includes a second sealing portion,
the second sealing portion includes a plate-shaped body disposed facing the substrate, and
the first sealing portion seals an area provided between the substrate and the second sealing portion.

This configuration can improve the durability of the photoelectric conversion module.

(Technique 3)

The photoelectric conversion module according to Technique 1 or 2, further including a second sealing member,
the second sealing member is provided to prevent the first sealing portion from being exposed on a surface of the photoelectric conversion module, and includes a second sealing material different from the first sealing material.

This configuration can improve the durability of the photoelectric conversion module. Furthermore, this structure allows the photoelectric conversion module to be durable even when used outdoors.

(Technique 4)

The photoelectric conversion module according to Technique 3, wherein
the second sealing material includes at least one selected from the group consisting of polyisobutylene and an isobutylene-isoprene copolymer.

This configuration can improve the durability of the photoelectric conversion module. Furthermore, this structure allows the photoelectric conversion module to be durable even when used outdoors.

(Technique 5)

The photoelectric conversion module according to Technique 3 or 4, further including a filling material provided between the first sealing member and the second sealing member.

This configuration can improve the durability of the photoelectric conversion module.

(Technique 6)

The photoelectric conversion module according to Technique 5, wherein the filling material includes at least one selected from the group consisting of an oxygen absorbent material and a moisture absorbent material.

This configuration can improve the durability of the photoelectric conversion module.
(Technique 7)
The photoelectric conversion module according to any one of Techniques 1 to 6, wherein the photoelectric conversion element includes a perovskite compound.

This configuration can improve the photoelectric conversion efficiency of the photoelectric conversion module.
(Technique 8)
The photoelectric conversion module according to Technique 7, wherein the perovskite compound includes Pb.

This configuration can improve the photoelectric conversion efficiency of the photoelectric conversion module.
(Technique 9)
The photoelectric conversion module according to Technique 8, wherein
the perovskite compound is represented by a chemical formula $APbX_3$,
where A is at least one selected from the group consisting of $CH_3NH_3$, $NH_2CH_2NH_2$, K, Cs, and Rb, and
X is at least one selected from the group consisting of Cl, Br, and I.

This configuration can improve the incident photoelectric conversion efficiency of the photoelectric conversion module.

Examples

Hereinafter, the present disclosure will be explained in more detail with reference to Examples.

In Samples 1 to 11, samples with the structure shown in FIG. 1, that is, photoelectric conversion modules were used to evaluate the effectiveness of the first sealing member and the photoelectric conversion module of the present disclosure through a high-temperature durability test in an 85° C. dry environment.

In Samples 12 to 26, samples with the structure shown in FIG. 7, that is, photoelectric conversion modules were used to evaluate the effectiveness of the first sealing member, the second sealing member and the photoelectric conversion module of the present disclosure through a high-temperature high-humidity durability test in an 85° C. 85% RH environment.
(Sample 1)
(Production of Photoelectric Conversion Element)

A glass sheet 30 mm square and 0.7 mm thick was prepared as a substrate. Onto one surface of the glass, indium tin oxide (ITO) was sputtered so that the sheet resistance value would be 10Ω/□. In this way, a first electrode was formed on the substrate.

Titanium oxide ($TiO_2$) was sputtered onto the first electrode so that its thickness would be 30 nm.

Furthermore, an aggregate of $TiO_2$ nanoparticles was formed to have a thickness of 250 nm. In this way, an electron transport layer was formed on the first electrode.

By laser scribing (wavelength 1.06 μm, 3 W), excess parts of the first electrode and of the electron transport layer were removed.

Next, a raw material solution for the photoelectric conversion layer was prepared. The raw material solution was prepared by dissolving 2.91 g of formamidinium hydroiodide (($NH_2)_2CH_2I$), 0.57 g of methyl ammonium hydroiodide ($CH_3NH_3I$), and 10 g of lead iodide ($PbI_2$), in a mixed solvent of 23.3 mL of N,N-dimethylformamide (DMF) and 5.8 mL of dimethyl sulfoxide (DMSO).

The raw material solution (80 μL) was dropped onto the electron transport layer, and the substrate including the electron transport layer was rotated at 6000 rpm for 70 seconds using a spin coater. 30 to 60 seconds after the start of rotation, 1 mL of toluene was pipetted onto the rotating electron transport layer onto which the raw material solution had been dropped. Then, the substrate was heated on a hot plate at 115° C. for 30 minutes. In this way, a photoelectric conversion layer was formed on the electron transport layer.

Next, a hole transport material solution was prepared. The hole transport material solution was obtained by preparing a solution by adding 10 mg of PTAA and 6 μL of tertbutyl pyridine to 1 mL of toluene, and by adding to the solution a 4.8 μL solution prepared by dissolving 500 mg of LiTFSl in 1 mL of acetonitrile.

The hole transport layer was formed by dropping 100 μL of the hole transport material solution onto the photoelectric conversion layer and rotating with a spin coater at 4000 rpm for 30 seconds.

On the hole transport layer, ITO as a second electrode was formed by sputtering so that the sheet resistance value would be 10 Ω/□.

In order to expose the first electrode to which the terminal was to be bonded, the electron transport layer, the photoelectric conversion layer, the hole transport layer, and the second electrode each present at the part to be exposed were subjected to laser scribing (wavelength: 355 nm, output: 3 W), thereby removing the electron transport layer, the photoelectric conversion layer, and the hole transport layer at the part.

Terminals were bonded to each of the first electrode and the second electrode using a Cu wire (thickness: 160 μm, width: 2 mm) and a solder material (melting point: 219° C.), using an ultrasonic soldering iron.

In the same way, the conductive wires were bonded to each terminal with solder iron.
(Provision of First Filling Material and Production of First Sealing Member)

On a substrate (30 mm square, 0.7 mm thick) on which a photoelectric conversion element was formed, four polyolefin sheets (10 mm square, 0.6 mm thick, melting point: 70° C.), sufficiently large to cover the photoelectric conversion element, were laminated. A second sealing portion of the first sealing member formed of a glass sheet of the same size as the substrate (i.e., 30 mm square, 0.7 mm thick) was further disposed thereon to face the substrate, thereby forming a laminated glass sheet.

The laminated glass sheet was placed in a vacuum heat treatment furnace. After evacuation to 10 Pa, the glass was heated to 80° C. to melt the polyolefin sheets. After restoring the pressure to 100 Pa, the glass was cooled to room temperature, later the pressure was restored to 1 atm, and the laminated glass was taken out from the furnace. In this way, the first filling material and the second sealing portion of the first sealing member were provided.

A 190° C. melt of polyvinyl alcohol (JMR-3H manufactured by JAPAN VAM & POVAL CO., LTD., degree of polymerization: 110, degree of saponification: 80 mol %) as the first sealing material for configuring the first sealing portion of the first sealing member was poured into a gap of about 2 mm between the substrate and the second sealing portion, thereby sealing the first filling material mounted on the photoelectric conversion element, specifically, the entire side surface of the first filling material provided to cover the photoelectric conversion element. At this time, the conductive wires penetrated the first sealing member and remained led outside.

In this way, a photoelectric conversion module in Sample 1 was produced.

(Sample 2)

A photoelectric conversion module according to Sample 2 was produced in the same manner as Sample 1, except that a 205° C. melt of polyvinyl alcohol (JF-05 manufactured by JAPAN VAM & POVAL CO., LTD., degree of saponification: 98 mol %) was used as the first sealing material for configuring the first sealing portion of the first sealing member.

(Sample 3)

A photoelectric conversion module according to Sample 3 was produced in the same manner as Sample 1, except that a 220° C. melt of polyvinyl alcohol (VC-10 manufactured by JAPAN VAM & POVAL CO., LTD., degree of polymerization: 1000, degree of saponification: 99.5 mol %) was used as the first sealing material for configuring the first sealing portion of the first sealing member.

(Sample 4)

A photoelectric conversion module according to Sample 4 was produced in the same manner as Sample 1, except that a 240° C. melt of ethylene-vinyl alcohol (L171B manufactured by KURARAY CO., LTD., ethylene: 27 mol %, degree of saponification: 100 mol %) was used as the first sealing material for configuring the first sealing portion of the first sealing member.

(Sample 5)

A photoelectric conversion module according to Sample 5 was produced in the same manner as Sample 1, except that a 200® C. melt of ethylene-vinyl alcohol (E105B manufactured by KURARAY CO., LTD., ethylene: 44 mol %, degree of saponification: 100 mol %) was used as the first sealing material for configuring the first sealing portion of the first sealing member.

(Sample 6)

A photoelectric conversion module according to Sample 6 was produced in the same manner as Sample 1, except that a 195° C. melt of butylenediol-vinyl alcohol (BVE80490 manufactured by Nippon Chemical Industry Co., Ltd., degree of saponification: 99 mol %) was used as the first sealing material for configuring the first sealing portion of the first sealing member.

(Sample 7)

A photoelectric conversion module according to Sample 7 was produced in the same manner as Sample 1, except that a 220° C. melt was used as the first sealing material for configuring the first sealing portion of the first sealing member, where the melt was a mixture obtained by mixing rice grain-sized solid raw materials of polyvinyl alcohol (VC-10 manufactured by JAPAN VAM & POVAL CO., LTD., degree of polymerization: 1000, degree of saponification: 99.5 mol %) and ethylene-vinyl alcohol (L171B manufactured by KURARAY CO., LTD., ethylene: 27 mol %, degree of saponification: 100 mol %) at a mass ratio of 1:1.

(Sample 8)

A photoelectric conversion module according to Sample 8 was produced in the same manner as Sample 1, except that a 240° C. melt was used as the first sealing material for configuring the first sealing portion of the first sealing member, where the melt was a mixture obtained by mixing rice grain-sized solid raw materials of polyvinyl alcohol (VC-10 manufactured by JAPAN VAM & POVAL CO., LTD., degree of polymerization: 1000, degree of saponification: 99.5 mol %) and butylenediol-vinyl alcohol (BVE8049Q manufactured by Nippon Chemical Industry Co., Ltd., degree of saponification: 99 mol %) at a mass ratio of 1:1.

(Sample 9)

(Production of Photoelectric Conversion Element)

A photoelectric conversion element was produced on the substrate in the same manner as Sample 1, and terminals and conductive wires were bonded to both the first and second electrodes.

(Provision of First Filling Material and Production of First Sealing Member)

A first filling material and a second sealing portion of a first sealing member were provided in the same manner as Sample 1, except that an iron powder (JIP 303A-60 manufactured by JFE Steel Corporation) as an oxygen scavenger was provided between the four polyolefin sheets at a mass ratio of polyolefin sheets:iron powder=9:1.

The first sealing member was produced in the same manner as Sample 1, except that, similar to Sample 4, a 240° C. melt of ethylene-vinyl alcohol (L171B manufactured by KURARAY CO., LTD., ethylene: 27 mol %, degree of saponification: 100 mol %) was used as the first sealing material for configuring the first sealing portion of the first sealing member.

In this way, a photoelectric conversion module according to Sample 9 was produced.

(Sample 10)

A photoelectric conversion module according to Sample 10 was produced in the same manner as Sample 1, except that the first sealing portion of the first sealing member was not produced.

(Sample 11)

A photoelectric conversion module according to Sample 11 was produced in the same manner as Sample 1, except that a 220° C. melt of polyvinylidene chloride (223-0255 manufactured by FUJIFILM Wako Pure Chemical Corporation) was used as the first sealing material for configuring the first sealing portion of the first sealing member.

(Evaluation of Photoelectric Conversion Module)

The photoelectric conversion modules according to Samples 1 to 11 were stored in the following environment, and the storage time and output of the photoelectric conversion modules after elapsing the storage time was recorded.

The storage environment was a dry environment with a temperature of 85° C. and a dew point of −40° C. As to the output of the photoelectric conversion module, light from a low-intensity light source (fluorescent light, illuminance: 200 lx) was irradiated, and the current value was measured at the time of changing the voltage from −0.2 V to 1.0 V in steps of 0.02 V using a curve tracer (Source meter 2242, manufactured by ADCDC). The maximum output value calculated from the above measurement results was determined as the output of the photoelectric conversion module.

The changes over time in the maximum output of Samples 1 to 11 of the photoelectric conversion modules were measured. The composition of each sample is shown in Table 1, and the evaluation results are shown in Table 2. The output retention rate shown in Table 2 is the proportion of the maximum output after the storage time has elapsed, taking the maximum output before exposure to the storage environment as 100%.

TABLE 1

| | Substrate | Second sealing portion | First filling material | First sealing material |
|---|---|---|---|---|
| Sample 1 | Glass | Glass sheet | Polyolefin | Polyvinyl alcohol JMR-3H |
| Sample 2 | Glass | Glass sheet | Polyolefin | Polyvinyl alcohol JF-05 |
| Sample 3 | Glass | Glass sheet | Polyolefin | Polyvinyl alcohol VC-10 |
| Sample 4 | Glass | Glass sheet | Polyolefin | Ethylene-vinyl alcohol copolymer L171B |
| Sample 5 | Glass | Glass sheet | Polyolefin | Ethylene-vinyl alcohol copolymer E105B |
| Sample 6 | Glass | Glass sheet | Polyolefin | Butylenediol-vinyl alcohol copolymer BVE8049Q |
| Sample 7 | Glass | Glass sheet | Polyolefin | Polyvinyl alcohol VC-10 + Ethylene-vinyl alcohol copolymer L171B (Mixing mass ratio 1:1) |
| Sample 8 | Glass | Glass sheet | Polyolefin | Polyvinyl alcohol VC-10 + Butylenediol-vinyl alcohol copolymer BVE8049Q (Mixing mass ratio 1:1) |
| Sample 9 | Glass | Glass sheet | Polyolefin + Iron powder (mass ratio 9:1) | Ethylene-vinyl alcohol copolymer L171B |
| Sample 10 | Glass | Glass sheet | Polyolefin | None |
| Sample 11 | Glass | Glass sheet | Polyolefin | Polyvinylidene chloride |

TABLE 2

| | Output retention rate (%) after dry test 85° C. | | | | | | |
|---|---|---|---|---|---|---|---|
| | 2 hours after | 26 hours after | 50 hours after | 4 days after | 8 days after | 20 days after | 40 days after |
| Sample 1 | 102 | 100 | 100 | 99 | 100 | 98 | 94 |
| Sample 2 | 99 | 100 | 99 | 98 | 99 | 98 | 98 |
| Sample 3 | 101 | 99 | 99 | 100 | 99 | 98 | 98 |
| Sample 4 | 100 | 99 | 100 | 99 | 99 | 99 | 98 |
| Sample 5 | 100 | 100 | 99 | 97 | 98 | 97 | 94 |
| Sample 6 | 99 | 100 | 98 | 97 | 96 | 95 | 93 |
| Sample 7 | 100 | 100 | 99 | 98 | 99 | 98 | 95 |
| Sample 8 | 98 | 99 | 99 | 99 | 97 | 98 | 93 |
| Sample 9 | 100 | 99 | 98 | 99 | 98 | 99 | 98 |
| Sample 10 | 99 | 80 | 20 | 12 | 10 | 12 | 11 |
| Sample 11 | 99 | 98 | 98 | 95 | 90 | 65 | 40 |

DISCUSSION

In Samples 1 to 9, the output retention rate was kept at 90% or more even after 40 days. However, in Sample 10 not having a first sealing portion formed of the first sealing material, its output retention rate was below 90% after 26 hours. In Sample 11 where the first sealing material was polyvinylidene chloride, the output retention rate was below 90% after 20 days. This indicates that the sealing function by the first sealing member including the first sealing material is effective when the first sealing member include at least one selected from the group consisting of polyvinyl alcohol, an ethylene-vinyl alcohol copolymer, and a butylenediol-vinyl alcohol copolymer.

In Sample 7, the first sealing material is polyvinyl alcohol VC-10 and an ethylene-vinyl alcohol copolymer L171B (mixing mass ratio 1:1), and in Sample 8, the first sealing material is polyvinyl alcohol VC-10 and butylenediol-vinyl alcohol copolymer BVE8049Q (mixing mass ratio 1:1). In either Sample 7 or Sample 8, there is substantially no problem with the sealing performance of the first sealing member, indicating that these vinyl alcohol-based polymer materials can be used in a mixture.

(Sample 12)
(Production of Photoelectric Conversion Element)

A photoelectric conversion element was formed on the substrate in the same manner as Sample 1, and terminals and conductive wires were bonded to both the first electrode and the second electrode.

(Provision of First Filling Material and Production of First Sealing Member)

In the same manner as Sample 1, the first filling material was provided and the first sealing member was produced.

(Production of Second Filling Material)

A second filling material was produced by pouring a melt of an ethylene-vinyl acetate copolymer (EVA) into a gap of approximately 2 mm between the substrate and the second sealing portion of the first sealing member.

(Production of Second Sealing Member)

In a gap of about 2 mm between the substrate and the second sealing portion of the first sealing member, a second sealing member was formed at a sealing width of 4 mm, using a 200° C. melt of butyl rubber (HX-760BB manufactured by Aica Kogyo Co., Ltd.). That is, the second sealing member was formed between the substrate and the periphery of the second sealing portion of the first sealing member so that the first sealing portion of the first sealing member and the second filling material would be sealed. At this time, the conductive wires penetrated the second sealing member and remained led to the outside.

In this way, the photoelectric conversion module of Sample 12 was produced. In other words, the photoelectric conversion module according to Sample 12 corresponds to the photoelectric conversion module according to Sample 1 in a case where the photoelectric conversion module further includes a second filling material and a second sealing member.

(Sample 13)

A photoelectric conversion module according to Sample 13 was produced in the same manner as Sample 12, except that a 205° C. melt of polyvinyl alcohol (JF-05 manufactured by JAPAN VAM & POVAL CO., LTD., degree of saponification: 98 mol %) was used as the first sealing material for configuring the first sealing portion of the first sealing member. The photoelectric conversion module according to Sample 13 corresponds to the photoelectric conversion module according to Sample 2 in a case where the photoelectric conversion module further includes a second filling material and a second sealing member.

(Sample 14)

A photoelectric conversion module according to Sample 14 was produced in the same manner as Sample 12, except that a 220° C. melt of polyvinyl alcohol (VC-10 manufactured by JAPAN VAM & POVAL CO., LTD., degree of polymerization: 1000, degree of saponification: 99.5 mol %) was used as the first sealing material for configuring the first sealing portion of the first sealing member. The photoelectric conversion module according to Sample 14 corresponds to the photoelectric conversion module according to Sample 3 in a case where the photoelectric conversion module further includes a second filling material and a second sealing member.

(Sample 15)

A photoelectric conversion module according to Sample 15 was produced in the same manner as Sample 12, except that a 240° C. melt of ethylene-vinyl alcohol (L171B manufactured by KURARAY CO., LTD., ethylene: 27 mol %, degree of saponification: 100 mol %) was used as the first sealing material for configuring the first sealing portion of the first sealing member. The photoelectric conversion module according to Sample 15 corresponds to the photoelectric conversion module according to Sample 4 in a case where the photoelectric conversion module further includes a second filling material and a second sealing member.

(Sample 16)

A photoelectric conversion module according to Sample 16 was produced in the same manner as Sample 12, except that a 200° C. melt of ethylene-vinyl alcohol (E105B manufactured by KURARAY CO., LTD., ethylene: 44 mol %, degree of saponification: 100 mol %) was used as the first sealing material for configuring the first sealing portion of the first sealing member. The photoelectric conversion module according to Sample 16 corresponds to the photoelectric conversion module according to Sample 5 in a case where the photoelectric conversion module further includes a second filling material and a second sealing member.

(Sample 17)

A photoelectric conversion module according to Sample 17 was produced in the same manner as Sample 12, except that a 195° C. melt of butylenediol-vinyl alcohol (BVE80490 manufactured by Nippon Chemical Industry Co., Ltd., degree of saponification: 99 mol %) was used as the first sealing material for configuring the first sealing portion of the first sealing member. The photoelectric conversion module according to Sample 17 corresponds to the photoelectric conversion module according to Sample 6 in a case where the photoelectric conversion module further includes a second filling material and a second sealing member.

(Sample 18)

A photoelectric conversion module according to Sample 18 was produced in the same manner as Sample 12, except that a 220° C. melt was used as the first sealing material for configuring the first sealing portion of the first sealing member, where the melt was a mixture obtained by mixing rice grain-sized solid raw materials of polyvinyl alcohol (VC-10J manufactured by JAPAN VAM & POVAL CO., LTD., degree of polymerization: 1000, degree of saponification: 99.5 mol %) and ethylene-vinyl alcohol (L171B manufactured by KURARAY CO., LTD., ethylene: 27 mol %, degree of saponification: 100 mol %) at a mass ratio of 1:1. The photoelectric conversion module according to Sample 18 corresponds to the photoelectric conversion module according to Sample 7 in a case where the photoelectric conversion module further includes a second filling material and a second sealing member.

(Sample 19)

A photoelectric conversion module according to Sample 19 was produced in the same manner as Sample 12, except that a 240° C. melt was used as the first sealing material for configuring the first sealing portion of the first sealing member, where the melt was a mixture obtained by mixing rice grain-sized solid raw materials of polyvinyl alcohol (VC-10J manufactured by JAPAN VAM & POVAL CO., LTD., degree of polymerization: 1000, degree of saponification: 99.5 mol %) and butylenediol-vinyl alcohol (BVE8049Q manufactured by Nippon Chemical Industry Co., Ltd., degree of saponification: 99 mol %) at a mass ratio of 1:1. The photoelectric conversion module according to Sample 19 corresponds to the photoelectric conversion module according to Sample 8 in a case where the photoelectric conversion module further includes a second filling material and a second sealing member.

(Sample 20)

(Production of Photoelectric Conversion Element)

A photoelectric conversion element was produced on a substrate in the same manner as Sample 12, that is, in the same manner as Sample 1, and terminals and conductive wires were bonded to both the first electrode and the second electrode.

(Provision of First Filling Material and Production of First Sealing Member)

A first filling material and a second sealing portion of a first sealing member were provided in the same manner as Sample 12, except that an iron powder (JIP 303A-60 manufactured by JFE Steel Corporation) as an oxygen scavenger was provided between the four polyolefin sheets at a mass ratio of polyolefin sheet:iron powder=9:1 in provision of the first filling material.

A first sealing member was produced in the same manner as Sample 12, namely in the same manner as Sample 1, except that a 240° C. melt of ethylene-vinyl alcohol (L171B manufactured by KURARAY CO., LTD., ethylene: 27 mol %, degree of saponification: 100 mol %) was used as the first sealing material for configuring the first sealing portion of the first sealing member in the same manner as Sample 15.

After that, a second filling material and a second sealing member were produced in the same manner as Sample 12. In this way, a photoelectric conversion module according to Sample 20 was produced. In other words, the photoelectric conversion module according to Sample 20 corresponds to the photoelectric conversion module according to Sample 9 in a case where the photoelectric conversion module further includes a second filling material and a second sealing member.

(Sample 21)

A photoelectric conversion module according to Sample 21 was produced in the same manner as Sample 15, except that the second filling material used was prepared by adding a calcium oxide powder to a melt of ethylene-vinyl acetate copolymer (EVA) at mass proportion of 5%.

(Sample 22)

A photoelectric conversion module according to Sample 22 was produced in the same manner as Sample 12, except that a first sealing portion of a first sealing member was not produced. In other words, the photoelectric conversion module according to Sample 22 corresponds to the photoelectric conversion module according to Sample 10 in a case where the photoelectric conversion module further includes a second filling material and a second sealing member.

(Sample 23)

A photoelectric conversion module according to Sample 23 was produced in the same manner as Sample 12, except that the first sealing portion of the first sealing member and the second sealing member were not produced. In other words, the photoelectric conversion module according to Sample 23 corresponds to the photoelectric conversion module according to Sample 10 in a case where the photoelectric conversion module further includes a second filling material.

(Sample 24)

A photoelectric conversion module according to Sample 24 was produced in the same manner as Sample 14, except that a second sealing member was not produced. In other words, the photoelectric conversion module according to Sample 24 corresponds to the photoelectric conversion module according to Sample 3 in a case where the photoelectric conversion module further includes a second filling material.

(Sample 25)

A photoelectric conversion module according to Sample 25 was produced in the same manner as Sample 15, except that a second sealing member was not produced. In other words, the photoelectric conversion module according to Sample 25 corresponds to the photoelectric conversion module according to Sample 4 in a case where the photoelectric conversion module further includes a second filling material.

(Sample 26)

A photoelectric conversion module according to Sample 26 was produced in the same manner as Sample 12, except that a 220° C. melt of polyvinylidene chloride (223-0255 manufactured by FUJIFILM Wako Pure Chemical Corporation) was used as the first sealing material for configuring the first sealing portion of the first sealing member. In other words, the photoelectric conversion module according to Sample 26 corresponds to the photoelectric conversion module according to Sample 11 in a case where the photoelectric conversion module further includes a second filling material and a second sealing member.

(Evaluation of Photoelectric Conversion Module)

The photoelectric conversion modules according to Samples 12 to 26 were stored in the following environment, and the storage time and output of the photoelectric conversion modules after elapsing the storage time was recorded.

The storage environment was as follows. The gas composition was that of the air, the temperature was 85° C., and the relative humidity was 85%. As to the output of the photoelectric conversion module, light from a low-intensity light source (fluorescent light, illuminance: 200 lx) was irradiated, and the current value was measured at the time of changing the voltage from −0.2 V to 1.0 V in steps of 0.02 V using a curve tracer (Source meter 2242, manufactured by ADCDC). The maximum output value calculated from the above measurement results was determined as the output of the photoelectric conversion module.

The changes over time in the maximum output of the photoelectric conversion modules in Samples 12 to 26 were measured. The compositions of the respective Samples are shown in Table 3, and the evaluation results are shown in Table 4. The output retention rate shown in Table 4 is the proportion of the maximum output after the storage time has elapsed, taking the maximum output before exposure to the storage environment as 100%.

TABLE 3

|  | Substrate | Second sealing portion | First filling material | First sealing material | Second filling material | Second sealing material |
| --- | --- | --- | --- | --- | --- | --- |
| Sample 12 | Glass | Glass Sheet | Polyolefin | Polyvinyl alcohol JMR-3H | EVA | Butyl rubber |
| Sample 13 | Glass | Glass Sheet | Polyolefin | Polyvinyl alcohol JF-05 | EVA | Butyl rubber |
| Sample 14 | Glass | Glass Sheet | Polyolefin | Polyvinyl alcohol VC-10 | EVA | Butyl rubber |
| Sample 15 | Glass | Glass Sheet | Polyolefin | Ethylene-vinyl alcohol copolymer L171B | EVA | Butyl rubber |
| Sample 16 | Glass | Glass Sheet | Polyolefin | Ethylene-vinyl alcohol copolymer E105B | EVA | Butyl rubber |
| Sample 17 | Glass | Glass Sheet | Polyolefin | Butylenediol-vinyl alcohol copolymer BVE8049Q | EVA | Butyl rubber |
| Sample 18 | Glass | Glass sheet | Polyolefin | Polyvinyl alcohol VC-10 + Ethylene-vinyl alcohol copolymer L171B (mixing mass ratio 1:1) | EVA | Butyl rubber |
| Sample 19 | Glass | Glass Sheet | Polyolefin | Polyvinyl alcohol VC-10 + Butylenediol-vinyl alcohol copolymer BVE8049Q (mixing mass ratio 1:1) | EVA | Butyl rubber |
| Sample 20 | Glass | Glass sheet | Polyolefin + iron powder (mass ratio 9:1) | Ethylene-vinyl alcohol copolymerL171B | EVA | Butyl rubber |

TABLE 3-continued

| | Substrate | Second sealing portion | First filling material | First sealing material | Second filling material | Second sealing material |
|---|---|---|---|---|---|---|
| Sample 21 | Glass | Glass Sheet | Polyolefin | Ethylene-vinyl alcohol copolymer L171B | EVA + calcium oxide (mass ratio: 5%) | Butyl rubber |
| Sample 22 | Glass | Glass Sheet | Polyolefin | None | EVA | Butyl rubber |
| Sample 23 | Glass | Glass Sheet | Polyolefin | None | EVA | None |
| Sample 24 | Glass | Glass Sheet | Polyolefin | Polyvinyl alcohol VC-10 | EVA | None |
| Sample 25 | Glass | Glass Sheet | Polyolefin | Ethylene-vinyl alcohol copolymer L171B | EVA | None |
| Sample 26 | Glass | Glass Sheet | Polyolefin | Polyvinylidene chloride | EVA | Butyl rubber |

TABLE 4

| | Output retention rate (%) after test at 85° C., 85% RH | | | | | | |
|---|---|---|---|---|---|---|---|
| | After 2 hours | After 26 hours | After 50 hours | After 4 days | After 8 days | After 20 days | After 40 days |
| Sample 12 | 100 | 98 | 98 | 95 | 94 | 92 | 88 |
| Sample 13 | 99 | 97 | 98 | 98 | 97 | 97 | 95 |
| Sample 14 | 101 | 98 | 98 | 98 | 98 | 98 | 94 |
| Sample 15 | 100 | 99 | 100 | 99 | 99 | 97 | 93 |
| Sample 16 | 100 | 98 | 99 | 97 | 95 | 91 | 94 |
| Sample 17 | 99 | 98 | 98 | 96 | 96 | 96 | 92 |
| Sample 18 | 100 | 98 | 99 | 98 | 98 | 97 | 93 |
| Sample 19 | 98 | 99 | 99 | 98 | 96 | 98 | 93 |
| Sample 20 | 100 | 101 | 100 | 99 | 100 | 99 | 97 |
| Sample 21 | 100 | 100 | 100 | 99 | 99 | 100 | 98 |
| Sample 22 | 99 | 99 | 98 | 89 | 45 | 6 | 5 |
| Sample 23 | 56 | 12 | 8 | 7 | 7 | 5 | 4 |
| Sample 24 | 72 | 15 | 9 | 8 | 8 | 6 | 4 |
| Sample 25 | 81 | 20 | 12 | 10 | 8 | 8 | 6 |
| Sample 26 | 99 | 98 | 98 | 94 | 83 | 40 | 5 |

DISCUSSION

The output retention rates of the photoelectric conversion modules of Samples 12 to 21 shown in Table 4 for each storage time are approximately the same as those of the photoelectric conversion modules of Samples 1 to 9 in the dry environment shown in Table 2. This result shows that a photoelectric conversion module including further a second sealing member can be used even in a high temperature and high humidity environment.

In Sample 12 to Sample 21, the output retention rates remained at 88% or more even after 40 days, and particularly, in Samples 13 to 21, the output retention rate remained at 90% or more even after 40 days. On the other hand, in Sample 22 without a first sealing portion formed of the first sealing material, the output retention rate fell below 90% after 4 days. In Sample 23 with neither a first sealing member or a second sealing member, the output retention rate fell below 90% within 2 hours. Furthermore, in Sample 26 where the first sealing material was polyvinylidene chloride, the output retention rate fell below 90% after 8 days.

These results indicate that the second sealing member and the first sealing member used in Samples 12 to 21 can be effective even in a high temperature and high humidity environment.

Samples 24 and 25 without a second sealing member had configurations corresponding respectively to those of Samples 3 and 4 further provided with a second filling material. In Samples 24 and 25, the output retention rate fell below 90% within 2 hours in a humid environment. In other words, in a humid environment, Samples 12 to 21 that were further equipped with a second sealing member exhibited output retention rates superior to those of Samples 24 and 25. These results indicate that by providing a second sealing member in addition to the first sealing member, the photoelectric conversion module has durability even in a humid environment.

In Sample 18, the first sealing material is formed of polyvinyl alcohol VC-10 and ethylene-vinyl alcohol copolymer L171B (mixing mass ratio 1:1), and in Sample 19, the first sealing material is formed of polyvinyl alcohol VC-10 and butylenediol-vinyl alcohol copolymer BVE8049Q (mixing mass ratio 1:1). There is substantially no problem in these Samples, indicating that these vinyl alcohol-based polymer materials can be used in a mixture even in a high temperature and high humidity environment.

Furthermore, a comparison of Sample 15 with Samples 20 and 21 shows that addition of an oxygen scavenger to the first filling material and addition of calcium oxide as a moisture absorbent material to the second filling material provide additional effects on retaining the output.

INDUSTRIAL APPLICABILITY

The photoelectric conversion module of the present disclosure is useful because it exhibits improved performance than conventional photoelectric conversion modules in terms of both short-term and long-term reliability.

What is claimed is:

1. A photoelectric conversion module comprising:
a substrate;
a photoelectric conversion element;
a first sealing member; and
a second sealing member,
wherein the first sealing member comprises a first sealing portion formed of a first sealing material and a second sealing portion which is a plate-shaped body disposed facing the substrate,
the photoelectric conversion element is sealed by the substrate, the first sealing portion, and the second sealing portion,
the first sealing portion seals the area between the substrate and the second sealing portion and is positioned at an inner portion in an extension direction of the substrate, rather than at an end of the substrate and an end of the second sealing portion in the extension direction of the substrate,
the second sealing member comprises a second sealing material different from the first sealing material and is provided between the substrate and the second sealing portion to prevent the first sealing portion from being exposed on a surface of the photoelectric conversion module,
the first sealing material comprises at least one selected from the group consisting of polyvinyl alcohol, an ethylene-vinyl alcohol copolymer, and a butylenediol-vinyl alcohol copolymer, and
the second sealing material comprises at least one selected from the group consisting of polyisobutylene and an isobutylene-isoprene copolymer.

2. The photoelectric conversion module according to claim 1, further comprising a second filling material provided between the first sealing portion and the second sealing member.

3. The photoelectric conversion module according to claim 2, wherein the second filling material comprises at least one selected from the group consisting of an oxygen absorbent material and a moisture absorbent material.

4. The photoelectric conversion module according to claim 1, wherein the photoelectric conversion element comprises a perovskite compound.

5. The photoelectric conversion module according to claim 4, wherein the perovskite compound comprise Pb.

6. The photoelectric conversion module according to claim 5, wherein
the perovskite compound is represented by a chemical formula $APbX_3$,
where A is at least one selected from the group consisting of $CH_3NH_3$, $NH_2CH_2NH_2$, K, Cs, and Rb, and
X is at least one selected from the group consisting of Cl, Br, and I.

7. The photoelectric conversion module according to claim 1, further comprising a first filling material provided in an area sealed with the substrate, the first sealing portion and the second sealing portion.

8. The photoelectric conversion module according to claim 7, wherein the first filling material comprises at least one selected from the group consisting of an oxygen absorbent material and a moisture absorbent material.

9. The photoelectric conversion module according to claim 1, further comprising:
a terminal connected to the photoelectric conversion element; and
a conductive wire connected to the terminal; wherein
the conductive wire penetrates the first sealing portion and the second sealing member.

* * * * *